(12) United States Patent
Liu et al.

(10) Patent No.: US 8,673,520 B2
(45) Date of Patent: *Mar. 18, 2014

(54) INTENSITY SELECTIVE EXPOSURE PHOTOMASK

(75) Inventors: George Liu, Shin-Chu (TW); Kuei Shun Chen, Hsin-Chu (TW); Chih-Yang Yeh, Jhubei (TW); Te-Chih Huang, Chu-Bei (TW); Wen-Hao Liu, Zhubei (TW); Ying-Chou Cheng, Zhubei (TW); Boren Luo, Zhubei (TW); Tsong-Hua Ou, Taipei (TW); Yu-Po Tang, Taipei (TW); Wen-Chun Huang, Xi-Gang Xiang (TW); Ru-Gun Liu, Hsinchu (TW); Shu-Chen Lu, Zhudong Township, Hsinchu County (TW); Yu Lun Liu, Beidou Township, Changhua County (TW); Yao-Ching Ku, Hsinchu (TW); Tsai-Sheng Gau, Hsin Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 109 days.

This patent is subject to a terminal disclaimer.

(21) Appl. No.: 13/046,265

(22) Filed: Mar. 11, 2011

(65) Prior Publication Data

US 2011/0217630 A1     Sep. 8, 2011

Related U.S. Application Data

(63) Continuation-in-part of application No. 12/421,378, filed on Apr. 9, 2009, now Pat. No. 8,003,303.

(51) Int. Cl.
*G03F 1/00* (2012.01)

(52) U.S. Cl.
USPC ................................................ 430/5

(58) Field of Classification Search
USPC ................................................ 430/5
See application file for complete search history.

(56) References Cited

U.S. PATENT DOCUMENTS

| | | | |
|---|---|---|---|
| 5,821,013 A * | 10/1998 | Miller et al. | 430/5 |
| 6,093,507 A | 7/2000 | Tzu | |
| 8,003,303 B2 | 8/2011 | Liu et al. | |
| 2004/0197677 A1* | 10/2004 | Kohle et al. | 430/5 |
| 2009/0101906 A1 | 4/2009 | Hosoya et al. | |
| 2012/0040278 A1* | 2/2012 | Liu et al. | 430/5 |

* cited by examiner

*Primary Examiner* — Stewart Fraser
(74) *Attorney, Agent, or Firm* — Haynes and Boone, LLP

(57) ABSTRACT

An intensity selective exposure photomask, also describes as a gradated photomask, is provided. The photomask includes a first region including a first array of sub-resolution features. The first region blocks a first percentage of the incident radiation. The photomask also includes a second region including a second array of sub-resolution features. The second region blocks a second percentage of the incident radiation different that the first percentage. Each of the features of the first and second array includes an opening disposed in an area of attenuating material.

19 Claims, 8 Drawing Sheets

INTENSITY SELECTIVE EXPOSURE PHOTOMASK

CROSS REFERENCE TO RELATED APPLICATIONS

The present application is a continuation-in-part of U.S. Utility application Ser. No. 12/421,378, filed on Apr. 9, 2009, now U.S. Pat. No. 8,003,303 the entire disclosure of which is incorporated herein by reference.

BACKGROUND

The features used to create integrated circuits (ICs) are continually decreasing in feature size and spacing and/or increasing in density. Challenges arise however as topography varies across the substrate. For example, one region of a substrate may include a dense array of features while nearby area has an isolated feature. This topography can cause overlying layers to be deposited with non-uniform thickness, which may impact further processing.

Furthermore, understanding the variations in topography and the resulting non-uniform thickness of overlying areas prior to fabrication may allow for reduced cost, improved efficiency and like benefits. Therefore, what is needed is a feed-forward method of formation of a uniform layer on a semiconductor substrate overlying varying topography.

BRIEF DESCRIPTION OF THE DRAWINGS

The present disclosure is best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion. Furthermore, all features may not be shown in all drawings for simplicity.

DETAILED DESCRIPTION

Figure 1:
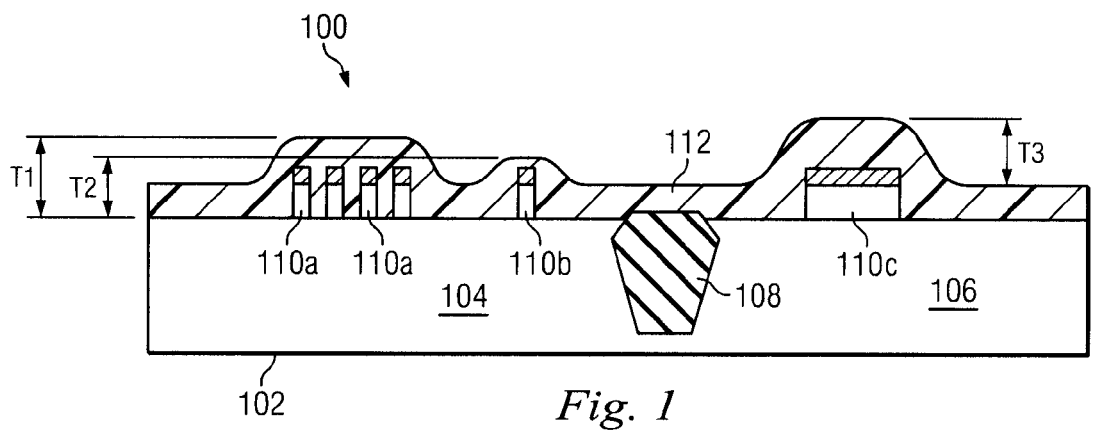
FIG. 1 is a cross-sectional view illustrating an embodiment of a non-uniform coating on a substrate.

The present disclosure relates generally to semiconductor device fabrication and photomasks for use in such fabrication. It is understood, however, that the following disclosure provides many different embodiments, or examples, for implementing different features of the invention. Specific examples of components and arrangements are described below to simplify the present disclosure. These are, of course, merely examples and are not intended to be limiting. Though described herein as an apparatus and/or method for fabricating semiconductor devices on a semiconductor substrate, various other embodiments are possible. For example, in fabrication of photomasks, TFT LCDs, and/or other technologies. In addition, the present disclosure may repeat reference numerals and/or letters in various examples. This repetition is for the purposes of simplicity and clarity and does not itself dictate a relationship between the various embodiments or configurations discussed. Furthermore, descriptions of a first layer "on," "overlying," and like descriptions, a second layer includes embodiments where the first and second layers are in direct contact as well as those where one or more layers interpose the first and second layer.

Referring to FIG. 1, illustrated is a cross-sectional view of a device 100 during a stage of fabrication. The device 100 includes a semiconductor substrate 102 including a first section 104 and a second section 106. An isolation feature 108 interposes the first section 104 and the second section 106. The isolation feature 108 may be a shallow trench isolation (STI) feature. In section 104, a plurality of features 110a and 110b are disposed on the substrate. A layer 112 has a first thickness T1 overlying the dense arrangement (e.g., increased pattern density) of features 110a, a second thickness T2 overlying the isolated feature 110b. T1 is greater than T2. Similarly, the topography of the second section 106 of the substrate 102 also affects the thickness of the layer 112. The feature 110c provides a step height T3 of the layer 112.

In an embodiment, the layer 112 is a coating of photosensitive material (e.g., photoresist). The non-uniform thickness of the layer 112 may cause issued with further processing of the semiconductor device 100. For example, in an etch back process of the layer 112, the isolation feature 108 may be damaged by the etch process as a thinner layer 112 overlies the isolation feature 108.

Figure 3:
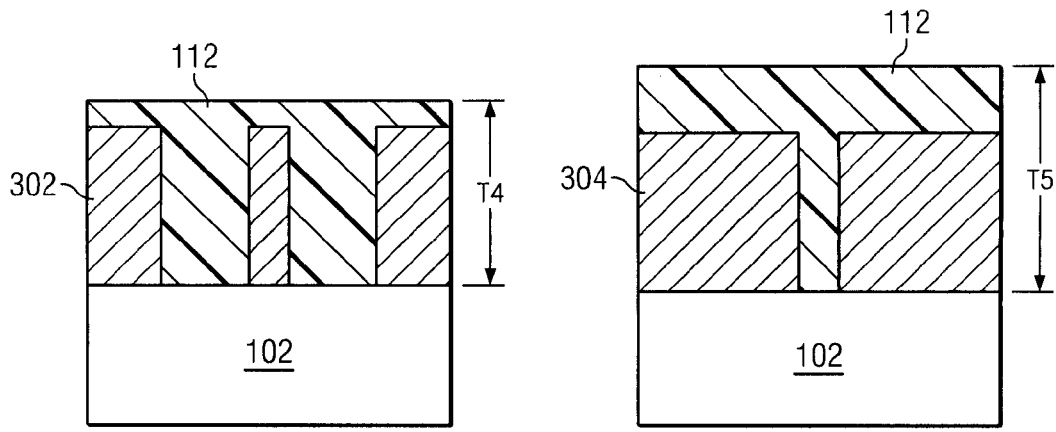
FIG. 3 is a plurality of cross-sectional view illustrating two embodiments of a pattern density and an overlying photoresist layer.

FIG. 1 illustrates, in a relative context, that the lower the pattern density, the lower the overlying coating thickness. Similarly, the greater the pattern density the greater the photoresist thickness. This is also illustrated in FIG. 3, which shows features with a lower pattern density 302 and features with a higher pattern density 304. The layer (e.g., photoresist) 112 overlying the features with the lower pattern density 302 has a thickness T4. The layer (e.g., photoresist) 112 overlying the features with the higher pattern density 304 has a thickness T5. T5 is greater than T4. The relationship between pattern density and an overlying coating layer, such as photoresist, is graphically illustrated in FIG. 6. It is noted that terms such as lower, higher, greater, provide relative comparisons only and do not imply any absolute value.

Figure 2:
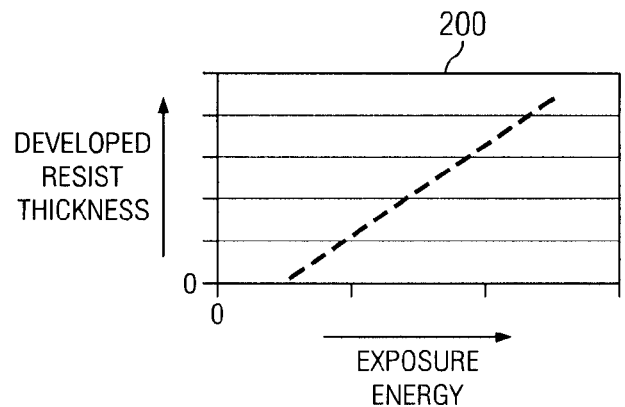
FIG. 2 is a graph illustrating a relationship between exposure energy and a thickness of photoresist that is developed by the energy.

Referring now to FIG. 2, illustrated is a graph 200 which shows an embodiment of a relationship between exposure energy and the thickness of developed photosensitive material. The graph 200 illustrates that greater the exposure energy (e.g., the greater the energy/intensity of a radiation beam incident a target surface of photosensitive material), the greater the thickness of photosensitive material that is developed. The energy of a radiation beam is also described herein as an intensity. Intensity may be expressed as a percentage of radiation; the percentage being relative to the radiation from the source, the radiation incident on the photomask, and/or relative to the radiation traversing another area of the photomask. Therefore, an intensity selective exposure may allow for different thickness of photosensitive material to be exposed and subsequently removed in a development process at different positions on a target substrate. The intensity selective exposure may be applied to a non-uniform coating of photosensitive material (e.g., layer 112 described above with reference to FIG. 1) to selectively reduce the thickness of the coating by developing greater amounts of photoresist at specific regions, as further described below.

Figure 4:
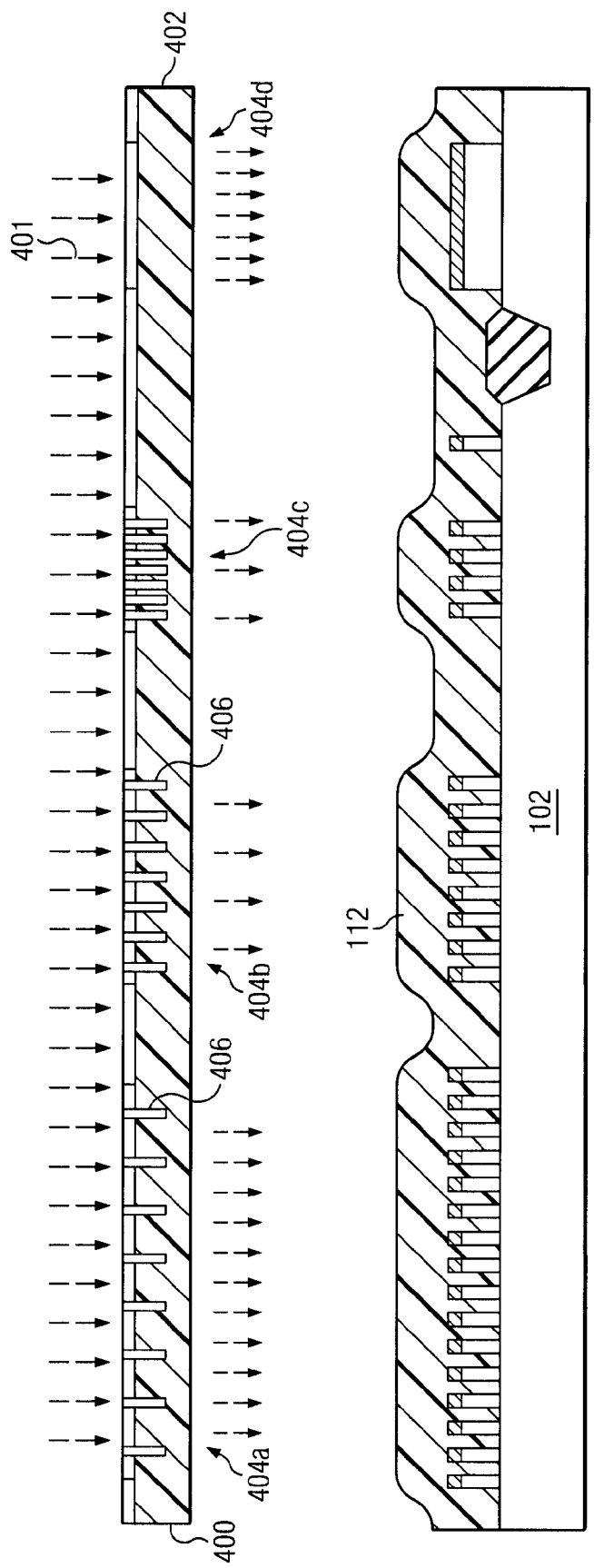
FIG. 4 is a cross-sectional view illustrating an embodiment a photomask and a corresponding target substrate.

Referring now to FIG. 4, illustrated is an embodiment of a photomask 400. A photomask may also be referred to as a "mask" or "reticle". The photomask 400 is referred to herein as a gradated photomask or an intensity selective photomask. The gradated photomask 400 provides an intensity selective exposure of a substrate. The gradated photomask 400 includes regions providing for different intensities of radiation to traverse the photomask 400. For example, the gradated photomask 400 includes a first exposure region 404a, a second exposure region 404b, a third exposure region 404c, and a fourth exposure region 404d. In an embodiment, each of the regions 404a, 404b, 404c, 404d allow a different intensity of radiation to traverse the mask. The regions 404a, 404b, 404c, 404d each include a plurality of features 406. The arrangement and composition of these features 406 provide the variations in intensity of radiation that traverses the photomask. The features 406 are sub-resolution features such that they will not be imaged directly onto the target substrate (e.g., nonprinting features).

As described above, and in the incorporated application Ser. No. 12/421,378, the gradated photomask 400 provides an intensity selective exposure in that different intensities of the radiation traverse the photomask in different regions. Therefore, different intensities or energies of radiation are incident a target substrate at different regions or sections. This allows for a different amount of a photosensitive layer to be exposed and removed during the development process.

Specifically, the photomask 400 includes a substrate 402. The substrate 402 may include a transparent substrate such as fused silica ($SiO_2$). A plurality of features are disposed on (or in) the substrate 402. In an embodiment, the photomask 400 is a binary intensity mask (BIM or binary mask). The binary intensity mask may include features of chrome and areas of transparent substrate, such as fused $SiO_2$. In other embodiments, the photomask 400 may be another mask technology known in the art such as, an alternating phase shift mask (AltPSM), and attenuating phase shift mask (AttPSM), chromeless phase shift pattern mask, and/or other suitable types. Other examples of attenuating material that may be formed on the substrate 402 include Au, MoSi, CrN, Mo, $Nb_2O_5$, Ti, Ta, $MoO_3$, MoN, $Cr_2O_3$, TiN, ZrN, $TiO_2$, TaN, $Ta_2O_5$, NbN, $Si_3N_4$, ZrN, $Al_2O_3N$, $Al_2O_3R$, or a combination thereof.

In an embodiment, the graduated photomask 400 includes no main features that are to be imaged onto the substrate. Though no main feature may be provided in the photomask 400, the photomask 400 may be associated with a specific integrated circuit or circuits and/or included in a mask set where other masks in the set are used to define the main features of an IC. Example main features include gate structures, interconnect features, contacts, source/drain regions, isolation regions, doped wells, and/or other suitable features of a semiconductor device.

In use, the photomask 400 is placed in a photolithography apparatus between a radiation source and a target substrate. The incident radiation is illustrated as radiation 401. The radiation source provides radiation beams directed to the target substrate, which passes through the photomask. The radiation source may be any suitable light source such as an ultra-violet (UV), or deep ultra-violet (DUV) source. More specifically, the radiation source may be, a mercury lamp having a wavelength of 365 nm (I-line); a Krypton Fluoride (KrF) excimer laser with wavelength of 248 nm; or an Argon Fluoride (ArF) excimer laser with a wavelength of 193 nm.

FIG. 4 also illustrates a target substrate 102. The target substrate 102 may be a semiconductor substrate (e.g., wafer) having silicon, germanium, diamond, or a compound semiconductor. The substrate may alternatively include other materials such as glass for thin-film transistor liquid crystal display (TFT LCD) devices or fused silicon/calcium fluoride for photomask. The target substrate may include a plurality of layers formed thereon, each having patterned structures. The target substrate may be coated with the layer 112, which is a photosensitive imaging layer used in the lithography patterning process. An exemplary composition of the layer 112 material is chemical amplified photoresist (CAR).

The photomask 400 is associated with the target substrate 102 in that the photomask 400 is aligned with and used to expose portions of the target substrate 102. Specifically, the photomask 400 is used for intensity selective exposure of the target substrate 102, as described below. The target substrate 102 includes a semiconductor substrate (e.g., wafer) having a varied topography including a different density, quantity, and/or size of features formed thereon, and the overlying layer 112. The layer 112 has a varying thickness due to the underlying pattern density, as described above. Regions of the photomask 400 providing exposure with greater relative intensity of radiation traversing the photomask 400 are aligned with those regions of the target substrate 102 having a greater relative thickness of the layer 112. In other words, the regions of the mask having a greater relative intensity of radiation traversing the photomask 400 may be arranged to expose regions of the target substrate 102 that have a higher pattern density of features.

Figure 9:
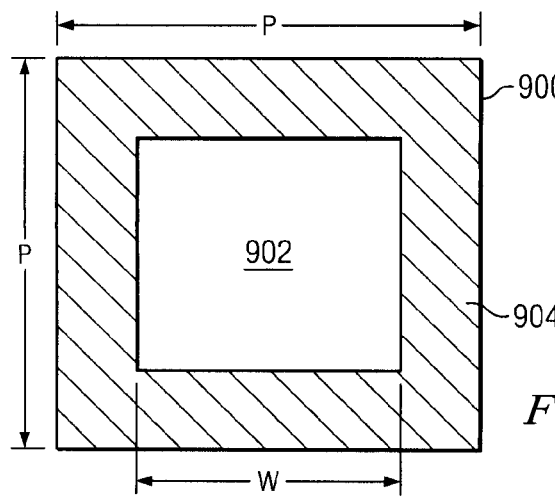
FIG. 9 is an embodiment of a pixel (e.g., feature) used in forming an intensity selective exposure photomask.

As described above, the gradated photomask 400 includes a pattern having a plurality of features 406 that provide for areas allowing for different intensity of radiation to traverse the photomask 400 (e.g., thereby providing an intensity selective exposure). The features 406 may be sub-resolution (e.g., do not result in an image formed on a target substrate). In an embodiment, the photomask includes a pattern having features 406 disposed in an array or a plurality of arrays. The array pattern(s) may include any plurality of features 406, also described herein pixels, in a repeating arrangement for at least a portion of the photomask 400. An exemplary pixel is provided in FIG. 9. The pixel 900 of FIG. 9 includes a window (e.g., opening) 902 of width W where radiation may pass. The opening 902 may be transparent substrate, such as fused $SiO_2$. The opening 902 is surrounded by an attenuating material region 904. The attenuating material region 904 may include chrome, Au, MoSi, CrN, Mo, $Nb_2O_5$, Ti, Ta, $MoO_3$, MoN, $Cr_2O_3$, TiN, ZrN, $TiO_2$, TaN, $Ta_2O_5$, NbN, $Si_3N_4$, ZrN, $Al_2O_3N$, $Al_2O_3R$, or a combination thereof. The attenuating material region 904 may be formed on a transparent substrate, such as fused $SiO_2$, as described above.

The pixel 900 has a size of P×P; however other shapes may be possible. The pixels 900 may be sub-resolution, e.g., the window 902 may be of a size such that no feature is formed on a target substrate when irradiated. An array may have pixels spaced a distance from one another or immediately adjacent. The spaced distance may be constant throughout the array. The array pattern of pixels may substantially similar to a contact hole array, except that they are sub-resolution.

As described above and illustrated in FIG. 9, each pixel includes an opening or window. By varying the width of the openings, the intensity of exposure traverse the photomask at that pixel is altered. For example, a greater width (e.g., W) of the opening provides for increased transmission. Therefore, by varying the width of the opening of the pixels, it is possible to provide a gradated mask operable to perform an intensity selective exposure. It is noted that the array of pixels is not necessarily formed across an entirety of a photomask (e.g., there may be areas without pixels). See the discussion of FIGS. 10-13. The array of pixels may be uniform (e.g., uniform width) or varying width W. In an embodiment, the pixels of a photomask include the same size, e.g., P.

The width W of the opening 902 may be less than approximately 0.25 µm. In an embodiment, the width W is between approximately 0.1 µm and approximately 0.25 µm. The size P may be approximately 0.35 µm. By way of example, in an embodiment, the pixel 900 includes a width W of approximately 0.25 µm and a size P of approximately 0.35 µm. In this embodiment, at an energy of E0=132 mj, the pixel 900 may provide a transmission rate of approximately 0.51 and a transmitted energy of approximately 67.35 mj. This provides a delta in thickness of a corresponding photoresist layer of approximately 1200 A (, the amount of photoresist removed after exposure and development processes is approximately 1200 A). In an alternative embodiment, the pixel 900 includes a width W of approximately 0.1 µm and a size P of approximately 0.35 µm. In such an embodiment, at an energy of E0=132 mj, a transmission rate of approximately 0.08 and a transmitted energy of approximately 10.78 mj may be produced. This embodiment may provide a delta in thickness of a corresponding photoresist layer of approximately 192 A. Therefore, varying the opening 902 width W between approximately 0.1 µm and approximately 0.25 µm, with a pixel size P of approximately 0.35 µm provides a difference in thickness of a target layer of photosensitive coating layer between approximately 192 A and approximately 1203 A. The pixel 900 may be repeated any number of times on a photomask including in one or more array patterns to provide varying radiation intensity to traverse the photomask.

Figure 5:
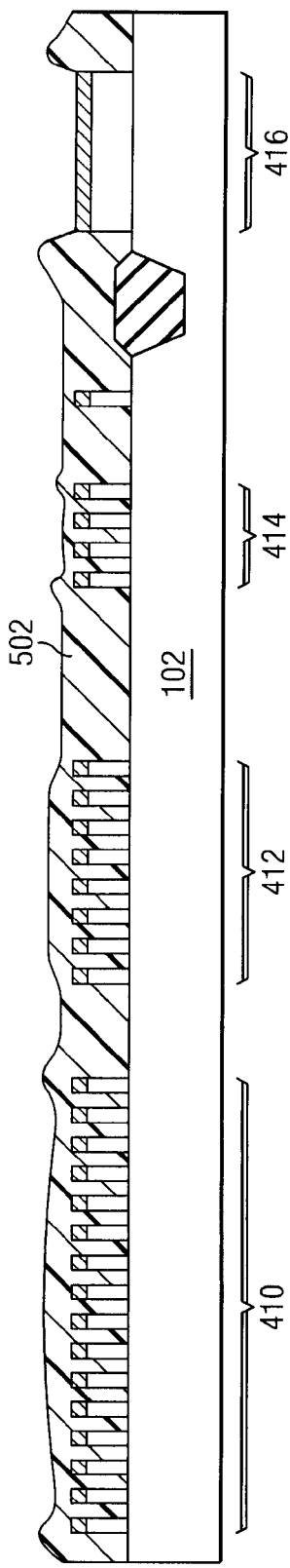
FIG. 5 is a cross-sectional view illustrating an embodiment of the substrate of FIG. 4 after exposure using the photomask of FIG. 4.

Referring now to FIG. 5, illustrated is an embodiment of the target 400 after exposure with the gradated mask 400, as illustrated in FIG. 4. Further processing may also be performed such as post-exposure bake (PEB), development process, rinse process, dry (e.g., spin dry) process, bake processes, and/or other suitable processes. Portions of the photosensitive layer, illustrated as layer 112 in FIG. 4, have been removed to provide photosensitive layer 502. The photosensitive layer 502 may be substantially planar and/or have improved planarity over the layer 112.

Figure 6:
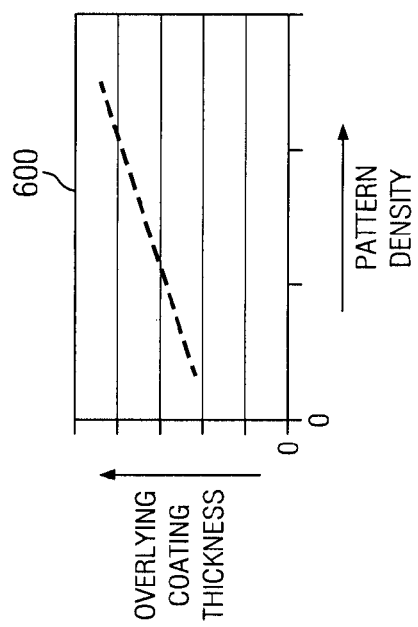
FIG. 6 is a flow chart illustrating a relationship between photoresist thickness and pattern density.

The above described result of varying thicknesses of coating applied over varying pattern densities is graphically represented in FIG. 6. FIG. 6 illustrates a graph 600 which shows the relationship between pattern density and an overlying layer thickness. In the illustrated embodiment, there is a linear correlation between pattern density and an overlying layer thickness. As illustrated by FIG. 6, an increased pattern density provides an increased overlying layer thickness. Thus, in an embodiment, a model can be developed from experimental data such as provided in the graph 600. The model may be used for any plurality of integrated circuit chip designs. The model may predict a coating thickness using a pattern density of the integrated circuit chip design. This is further discussed below with reference to FIG. 7.

Figure 7:
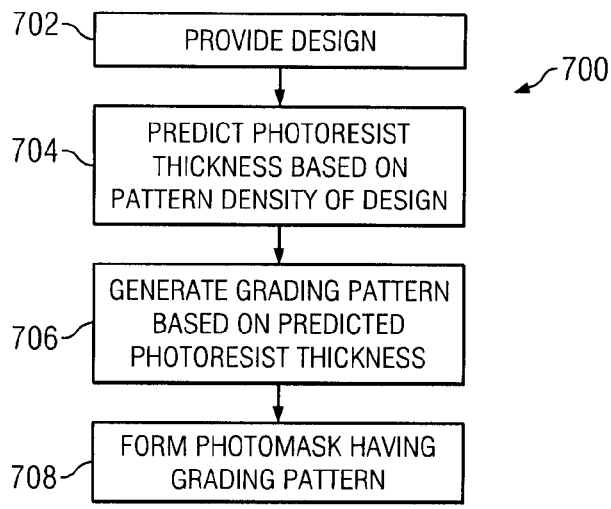
FIG. 7 is a flow chart illustrating an embodiment of a method of generating a photomask for intensity selective exposure.

Referring now to FIG. 7, illustrated is a method 700 for providing a graduated photomask, such as described above with reference to FIG. 4. The method 700 begins at step 702 where a design is provided. The design may include design data provided in any suitable file format. For example, the design may include a design layout provided in a GDSII, write file format (e.g., MEBES), and/or other suitable format. The design may include information on a layout of one or more layers of an integrated circuit device (IC). The design may include data regarding the pattern density of features (e.g., dummy and active) of the IC. The design may define features that include main or active features of the integrated circuit device such as, gate features, interconnect lines, plugs, dummy features, isolation features, and/or other typical features of semiconductor devices such as transistors.

The method 700 then proceeds to step 704 where a coating thickness(es) is predicted for the design. In an embodiment, the coating thickness predicted is the thickness of a photosensitive layer, such as the layer 112, described above. The coating thickness is predicted based on a pattern density defined by the design, described above with reference to step 702. For example, a pattern density is determined at one or more locations on a layer provided in the design, upon which a target coating will be formed. The prediction may also be based on the influence ambit (e.g., surrounding areas of a pattern density that may affect the thickness of the coating).

The prediction of the coating thickness may be generated from a model. The model may be developed based on experimental data (e.g., comparing pattern density and a resulting coating thickness). The model used to predict the thickness may be used for a plurality of different designs (e.g., different ICs). The prediction of the coating thickness is based on the factors described in the embodiments above; for example, in higher pattern density areas (e.g., dense patterns), the coating will be thicker than in isolated areas of the design. Thus, calculating the pattern density for an area gives a factor in determining the overlying coating thickness of that area. Pattern density may be calculated at any plurality of locations on the design (e.g., on the chip, wafer, etc). The prediction may be performed by the computer system 800, described in further detail below.

Having predicted the coating thickness for one or more portions of the design, the method 700 then proceeds to step 706 where a gradated pattern is generated. The gradated pattern is generated based on the predicted coating thickness. The gradated pattern is the pattern of features that is to be formed on a photomask (e.g., gradated photomask) that will provide selective intensity exposure. The gradated photomask may compensate for the predicted coating thickness variations, as described above with reference to FIG. 4. The gradated pattern may be provided as design data such as, a GDSII file, and/or any other suitable data file, which can be used to form a photomask. The gradated pattern may be associated with a specific integrated circuit design. The gradated pattern may provide for, when fabricated on a photomask, a greater intensity (energy) radiation incident the substrate in portions of the substrate having a thicker predicted coating layer and, likewise, a lesser intensity (energy) radiation incident the substrate in portions of the substrate having a predicted relative thinner coating layer.

In an embodiment, the gradated pattern generated is one or more arrays of pixels, such as the pixel 900, described above with reference to FIG. 9. As described above with reference to FIG. 4, the gradated pattern may include an array of such pixels where each pixel has a constant size (P, as described above). The array of pixels may also include a constant pitch, which includes a measurement between the centers of the openings of adjacent pixels. The gradated pattern may include one or more widths of a window or opening (W, as described above) in the pixel. In other embodiments, other features of differing configurations may be used to form the pattern. Examples of these configurations are described in U.S. Utility application Ser. No. 12/421,378, which is incorporated by reference, in its entirety.

Figure 10:
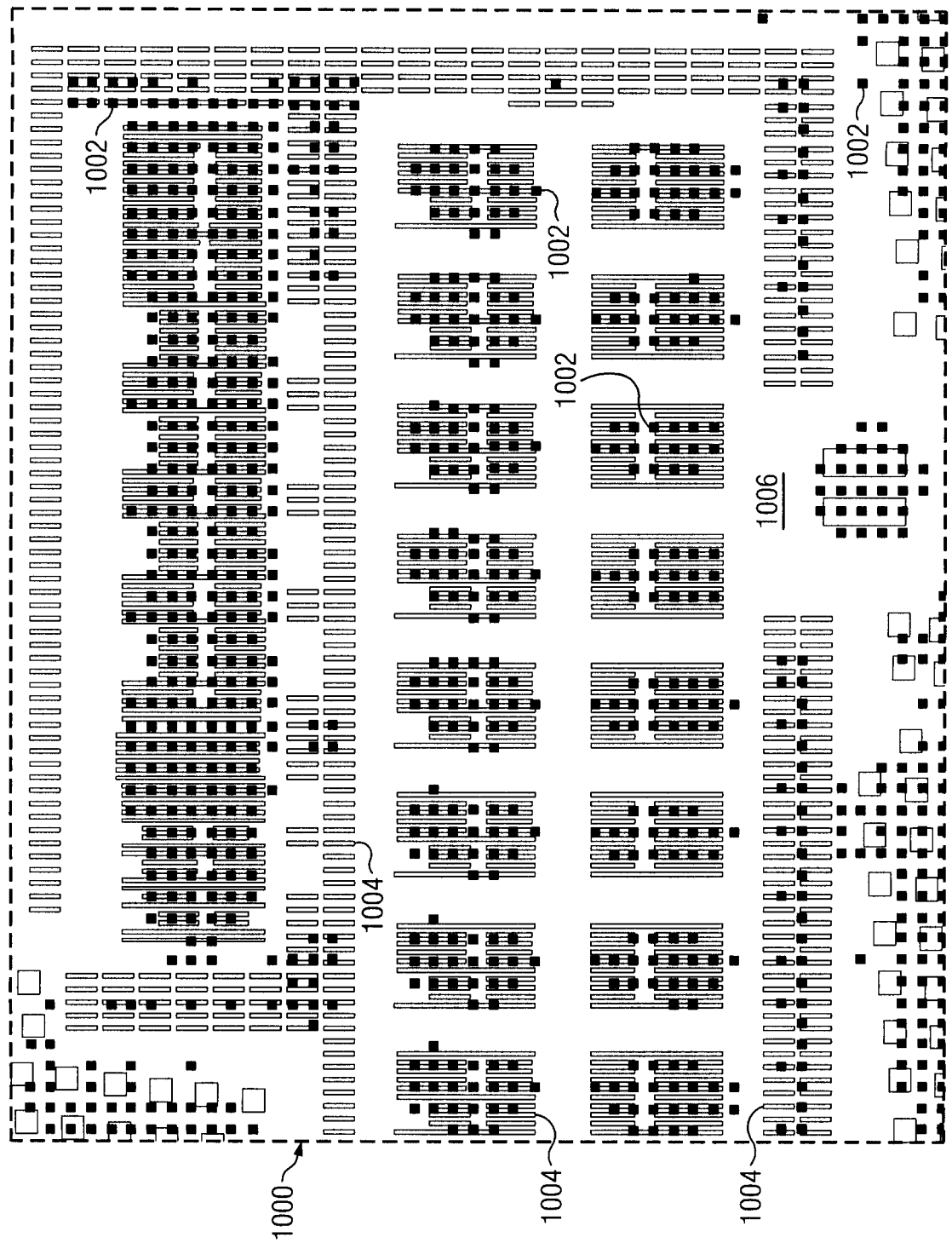
FIGS. 10-13 are top-views of embodiments of design data defining an intensity selective or gradated photomask and a layer of an integrated circuit design, according to one or more aspects of the present disclosure.

FIGS. 10-13 provide exemplary design data that include embodiments of graduated patterns. These patterns are provided by way of example, and are not intended to be limiting. FIG. 10 provides an exemplary design data 1000, which includes a gradated pattern 1002. The gradated pattern 1002 includes a plurality of pixels. The pixels may be substantially similar to the pixel 900, described above in FIG. 9. The pixels may be of constant size and/or pitch within an array or throughout a plurality of arrays formed on the substrate. The pixels may each include a window (e.g., opening) having a width. The widths of the windows in the gradated pattern 1002 may be substantially the same, or in other embodiments, may be different. It is noted that the gradated pattern 1002 includes space 1006, where no pixel is provided. The design data 1000 also includes main feature design data 1004. In an embodiment, the design data 1004 defines a gate structure for one or more semiconductor devices. The design data 1004 may be associated with a layer that is to be formed before a gradated or intensity selective photomask associated with the design data 1002 is used in the fabrication process. For example, the design data 1004 may be associated with a photomask used in a semiconductor device fabrication process and the design data 1002 may be the next (e.g., next subsequent) photomask in a mask set for the semiconductor device.

Figure 11:
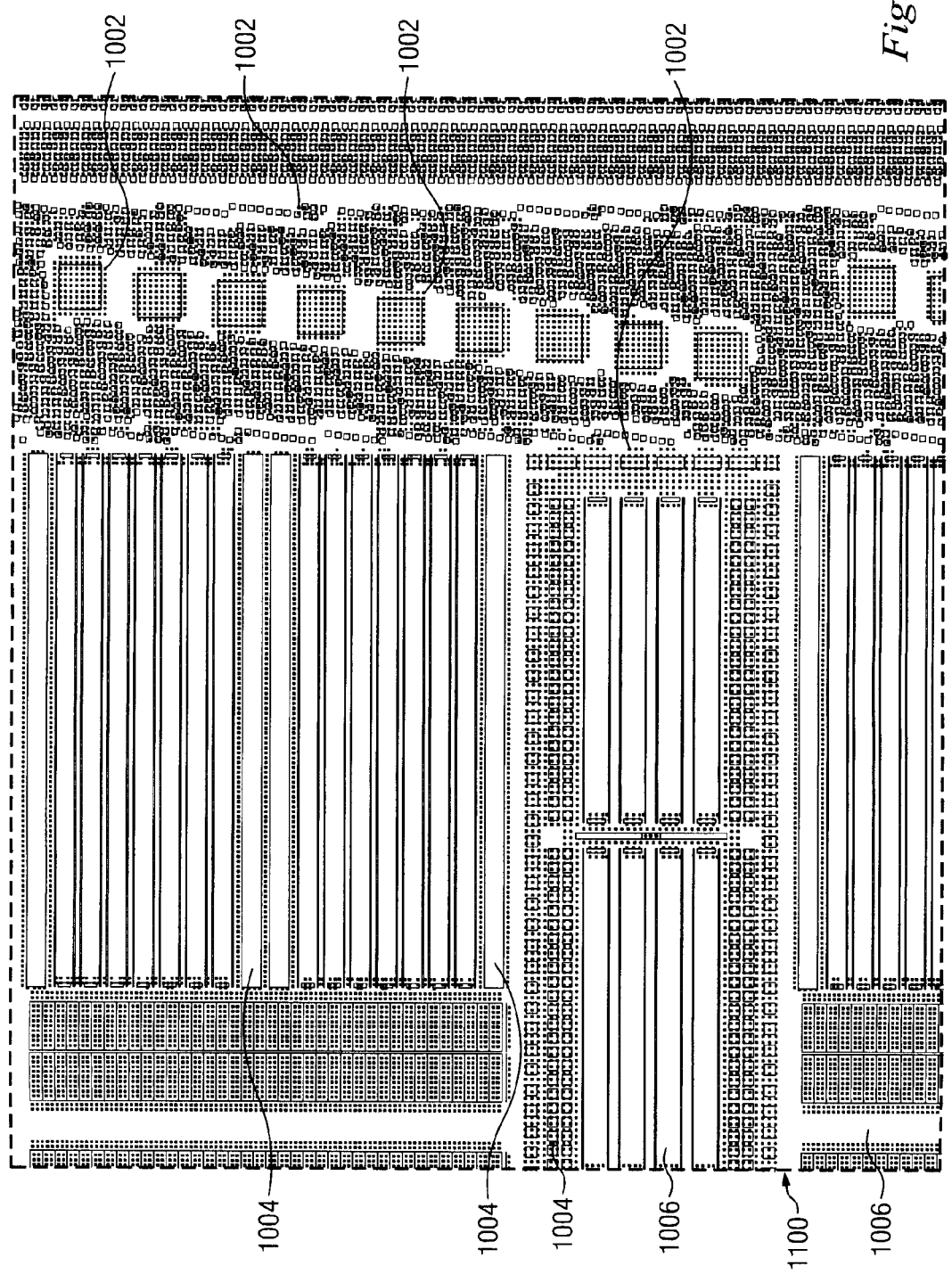
Figure 12:
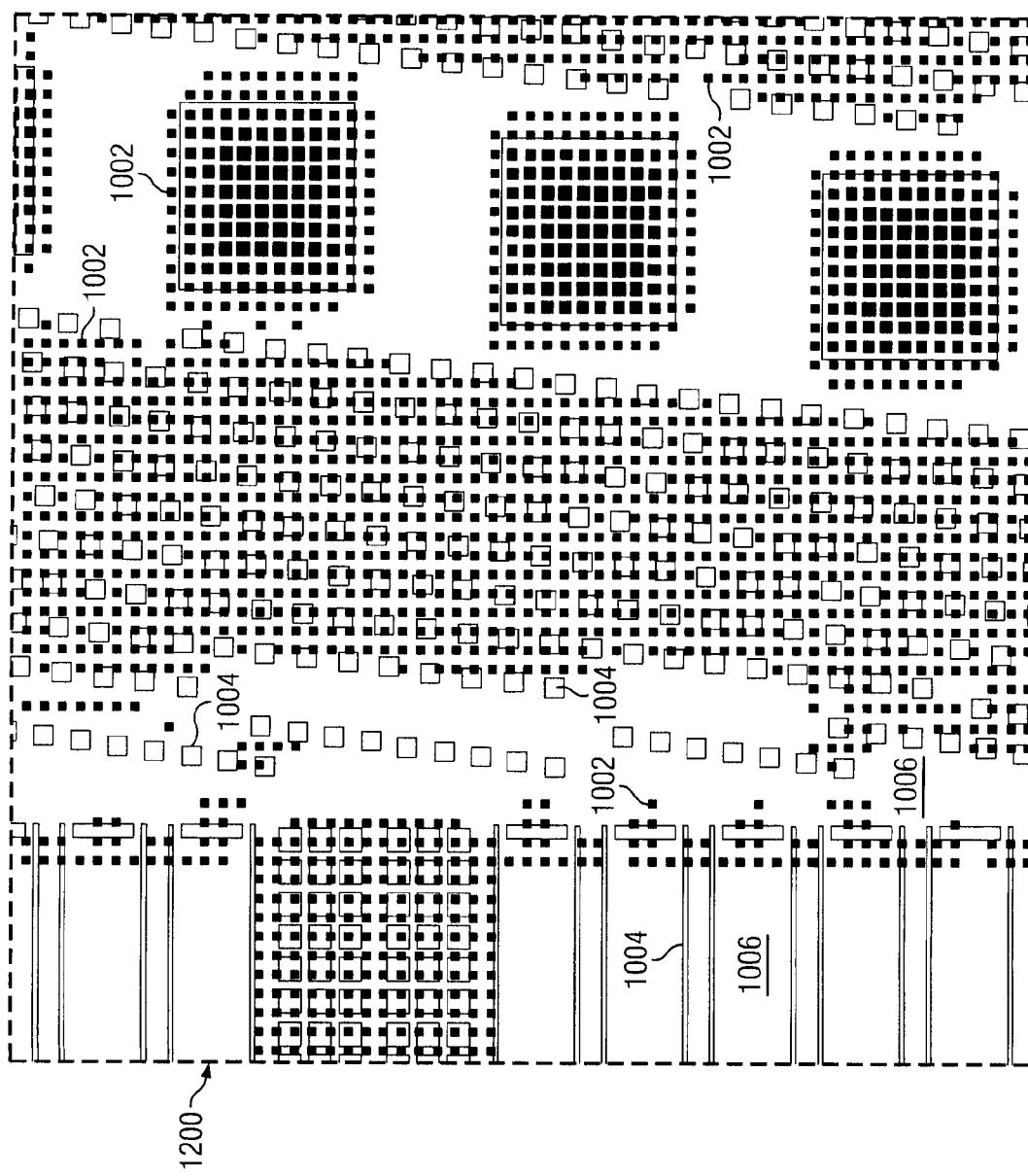
Figure 13:
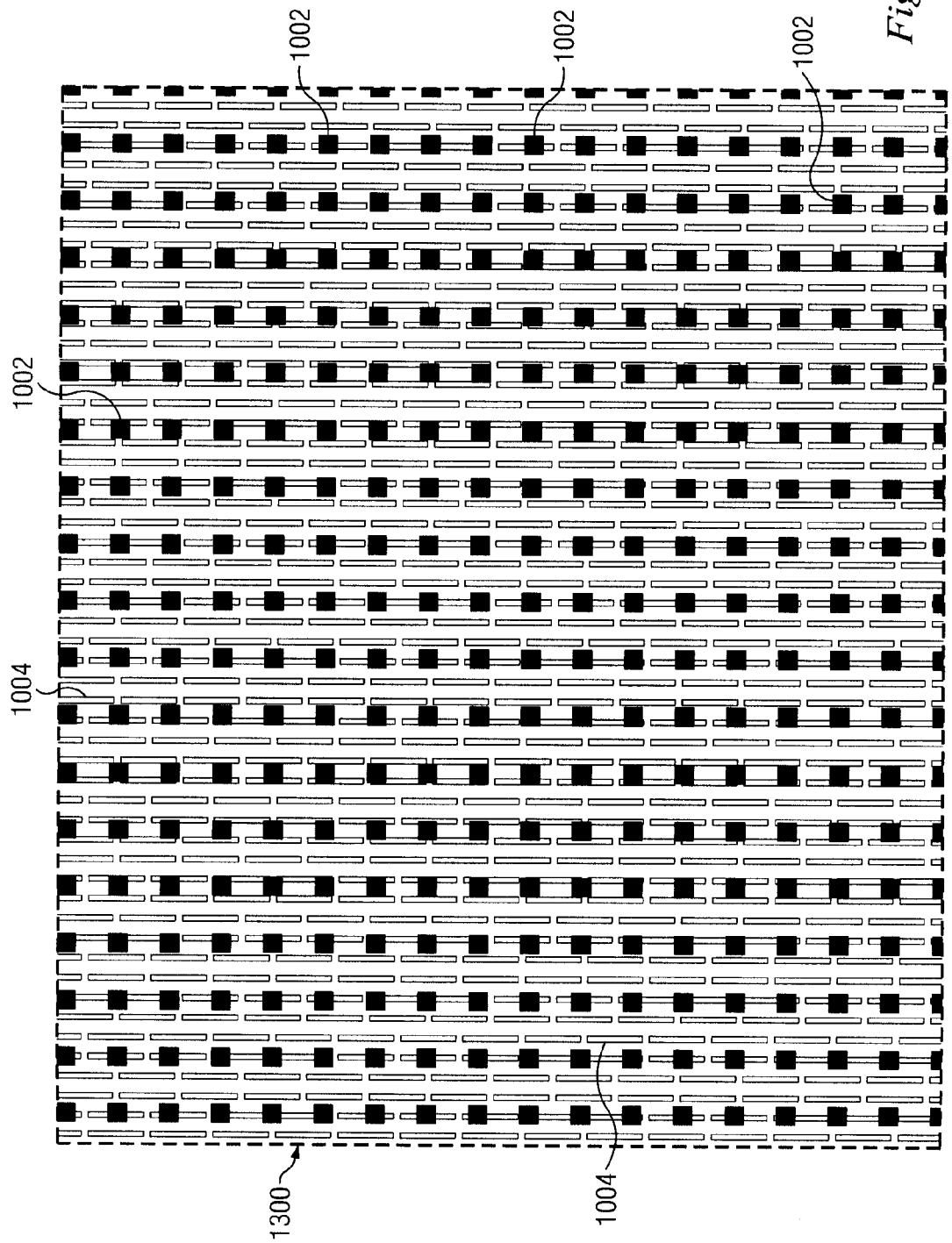

FIGS. 11, 12 and 13 illustrate design data 1100, 1200, and 1300 respectively, and may be substantially similar to as described above with reference to FIG. 10. The design data 1300 may be associated with a memory device (e.g., SRAM). The design data 1200 and/or 1100 may be associated with a logic portion of a semiconductor device.

Referring again to FIG. 7, the method 700 then proceeds to step 708 where a photomask having the gradated pattern is formed. The photomask may be substantially similar to the photomask 400, described above with reference to FIG. 4. The photomask may be referred to as a gradated photomask and may be operable to perform an intensity selective exposure. The gradated mask includes regions allowing different relative intensities of radiation to traverse the mask as defined by the grading pattern. The intensities may range between 0-100% of that of the radiation incident on the mask. The application Ser. No. 12/241,378 provides further detail as to the use of a photomask having an intensity selective exposure. For example, the gradated photomask may be used to develop portions of a coating (e.g., photosensitive layer) such that its planarity is improved.

Therefore, provided are embodiments of forming a gradated photomasks operable to provide for intensity selective exposure. One or more of the embodiments of the gradated photomask and/or intensity selective exposure process may allow for increasing the planarity of a layer on the substrate. A layer may suffer from non-uniformity as it overlies areas having varying pattern densities. One or more embodiments described herein provide for removing portions of material from a non-planar photosensitive material layer to improve its planarity. The gradated photomask may include a plurality of features (e.g., pixels) formed in an array, where each feature or pixel has an opening. The widths of the openings may be varied to vary the intensity of the radiation traversing that portion of the photomask.

The present disclosure also described embodiments where a gradated or intensity selective exposure photomask is designed using a feed-forward methodology. For example, by predicting a coating thickness based on a pattern density of a given design, the design of the gradated mask can be generated such that the mask can compensate for the thickness variations.

Figure 8:
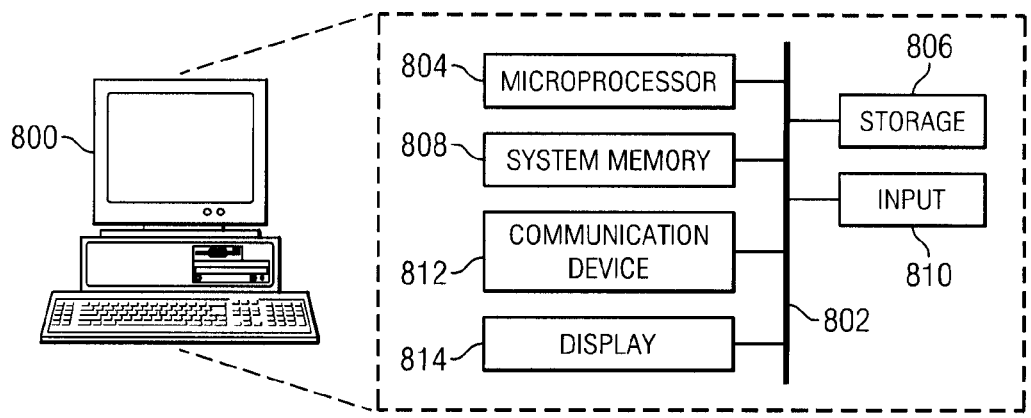
FIG. 8 is a block diagram of a computer system that may be used to perform one or more of the steps of the present disclosure.

Referring now to FIG. 8, shown therein is an illustrative information handling system 800 (e.g., computer) for implementing embodiments of the methods described above, such as the method 700. The computer system 800 includes a microprocessor 804, an input device 810, a storage device 806, a system memory 808, a display 814, and a communication device 812 all interconnected by one or more buses 802. The storage device 806 may be a floppy drive, hard drive, CD-ROM, optical device or any other storage device. In addition, the storage device 806 may be capable of receiving a floppy disk, CD-ROM, DVD-ROM, or any other form of computer-readable medium that may contain computer-executable instructions. The communications device 812 may be a modem, a network card, or any other device to enable the computer system to communicate with other nodes. It is understood that any computer system 800 could represent a plurality of interconnected computer systems such as, personal computers, mainframes, PDAs, and telephonic devices. The computer system 800 may include operable links to one or more entities, such as a mask fabrication house, an IC designer, a fabrication facility, and the like.

The computer system 800 includes hardware capable of executing machine-readable instructions as well as the software for executing acts (typically machine-readable instructions) that produce a desired result. Software includes any machine code stored in any memory medium, such as RAM or ROM, and machine code stored on other storage devices (such as floppy disks, flash memory, or a CD ROM, for example). Software may include source or object code, for example. In additional software encompasses any set of instructions capable of being executed in a client machine or server. Any combination of hardware and software may comprise a computer system. The system memory 808 may be configured to store a design database, library, technology files, design rules, PDKs, models, decks, and/or other information used in the design of a semiconductor device, including the design data of steps 702 and/or 706 of the method 700. The computer system 800 is also operable to store experimental data and/or generate a model based on upon experimental data, such as described above with reference to step 704 of the method 700.

Computer readable mediums include passive data storage, such as RAM as well as semi-permanent data storage such as a compact disk read only memory (CD-ROM). In an embodiment of the present disclosure may be embodied in the RAM of a computer to transform a standard computer into a new specific computing machine. Data structures are defined organizations of data that may enable an embodiment of the present disclosure. For example, a data structure may provide an organization of data, or an organization of executable code. Data signals could be carried across transmission mediums and store and transport various data structures, and thus, may be used to transport an embodiment of the present disclosure.

The computer system 800 may be used to implement one or more of the methods and/or devices described herein. In particular, the computer system 800 may be operable to generate, store, manipulate, and/or perform other actions on a layout pattern (e.g., GDSII file) associated with an integrated circuit. For example, in an embodiment, one or more of the patterns described above may be generated, manipulated, and/or stored using the computer system 800. The patterns provided by the computer system 800 may be in a typical layout design file formats, which are communicated to one or more other computer systems for use in fabricating photomasks including the defined patterns.

Thus, the present disclosure provides an embodiment of a device (e.g., mask set) which includes a gradated photomask. The gradated photomask includes a first region including a first array of sub-resolution features which blocks a first percentage of the incident radiation. The photomask further includes a second region including a second array of sub-resolution features, which blocks a second percentage of the incident radiation. The first and second percentage are different. Each of the sub-resolution features of the arrays includes an opening disposed in an area of attenuating material. See, e.g., FIG. 9.

In another embodiment, a photomask is described, which includes a plurality of sub-resolution features. Each feature has a window formed in a region of attenuating material. The features are arranged in a first array of features where each feature has a window having a first width formed in a first region of attenuating material. The features are further arranged in a second array of features where each feature has a window having a second width formed in a second region of attenuating material. The first width and the second width are different.

Further still, an embodiment of a feed-forward method of determining a photomask pattern is provided. The method includes providing design data associated with an integrated circuit device. A thickness of a coating layer to be used in fabricating the integrated circuit device is predicted based on the design data. This prediction is used to generate a gradating pattern. A photomask is formed having the gradating pattern.

The present disclosure has been described relative to a preferred embodiment. Improvements or modifications that become apparent to persons of ordinary skill in the art only after reading this disclosure are deemed within the spirit and scope of the application. It is understood that several modifications, changes and substitutions are intended in the foregoing disclosure and in some instances some features of the invention will be employed without a corresponding use of other features. Accordingly, it is appropriate that the appended claims be construed broadly and in a manner consistent with the scope of the invention.

What is claimed is:

1. A device, comprising:
   a gradated photomask including:
   a transparent substrate;
   a first region of the transparent substrate including a first array of a first plurality of sub-resolution features, wherein the first region blocks a first percentage of an incident radiation and wherein each of the sub-resolution features of the first plurality of sub-resolution features is an area of attenuating material surrounded by the transparent substrate, wherein each area of attenuating material includes a single opening in the attenuating material; and
   a second region of the transparent substrate including a second array of a second plurality of sub-resolution features, wherein the second region blocks a second percentage of the incident radiation different than the first percentage, and wherein each of the each of the sub-resolution features of the second plurality of sub-resolution features of the second array is an area of attenuating material surrounded by the transparent substrate, wherein each area has a single opening in the attenuating material.

2. The device of claim 1, wherein the regions of the first and second array have the same pitch.

3. The device of claim 1, wherein the openings have a width between approximately 0.25 μm and approximately 0.1 μm.

4. The device of claim 1, wherein the openings of the sub-resolution features of the first array have a first width, and the openings of the sub-resolution features of the second array have a second width greater than the first width.

5. The device of claim 1, wherein the opening is approximately a square.

6. The device of claim 1, wherein the gradated photomask does not include a pattern defining an integrated circuit feature.

7. The device of claim 1, further comprising:
   a second photomask, wherein the second photomask includes:
   a third region defining a first plurality of features having a first pattern density; and
   a fourth region defining a second plurality features having a second pattern density, wherein the third region of the second photomask and the first region of the gradated photomask are configured to expose a first section of a target substrate, and wherein the fourth region of the second photomask and the second region of the gradated photomask expose a second section of the target substrate.

8. The device of claim 7, wherein at least one of the first plurality of features and the second plurality of features of the second photomask are gate features of a semiconductor device.

9. The device of claim 7, wherein the first plurality of features and the second plurality of features of the second photomask define gate features of a semiconductor device.

10. A photomask, comprising:
    a plurality of sub-resolution features, wherein each of the plurality of sub-resolution features is a region of attenuating material where each region has a window formed within the region attenuating material such that the region includes an outer edge of attenuating material and an inner edge of attenuating material, the inner edge concentric with the outer edge and defining the window, wherein the regions of attenuating material are spaced a distance from one another, the plurality of sub-resolution features including:
    a first array of features each feature including a window having a first width formed in a first region of attenuating material; and
    a second array of features each feature including a window having a second width formed in a second region of attenuating material, wherein the first width and the second width are different.

11. The photomask of claim 10, wherein the first width is between approximately 0.25 μm and approximately 0.1 μm.

12. The photomask of claim 10, wherein the photomask includes no pattern defining a main feature of an integrated circuit device.

13. A method of forming a semiconductor device, comprising:
    using a gradated photomask, wherein the gradated photomask includes:
    a first region including a first array of attenuating material sub-resolution features, wherein the first region blocks a first percentage of an incident radiation, and wherein the first array of attenuating material sub-resolution features are spaced a first distance from one another; and
    a second region including a second array of attenuating material sub-resolution features, wherein the second region blocks a second percentage of the incident radiation different than the first percentage, and wherein the second array of attenuating material sub-resolution features are spaced the first distance from one another, and wherein each of the attenuating material sub-resolution features of the first and second array include an opening disposed in an area of attenuating material.

14. The method of claim 13, further comprising:
providing the incident radiation to the graduated photomask; and
exposing a photoresist layer on a target substrate by passing the incident radiation through the gradated photomask.

15. The method of claim 13, further comprising:
using a second photomask prior to using the graduated photomask, wherein the second photomask includes:
a third region defining a first plurality of features having a first pattern density; and
a fourth region defining a second plurality features having a second pattern density, wherein the third region of the second photomask and the first region of the gradated photomask are configured to expose a first section of a target substrate, and wherein the fourth region of the second photomask and the second region of the gradated photomask expose a second section of the target substrate.

16. The device of claim 1, wherein the opening is completely surrounded by the area of attenuating material.

17. The device of claim 1, wherein the regions of attenuating material of the first array are spaced a first distance from each other and wherein the regions of attenuating material of the second array are spaced a second distance from each other.

18. The device of claim 17, wherein the first and second distance are substantially equal.

19. The device of claim 1, wherein the regions of attenuating material are squares.

* * * * *